(12) United States Patent
Liu et al.

(10) Patent No.: US 10,211,297 B2
(45) Date of Patent: Feb. 19, 2019

(54) SEMICONDUCTOR HETEROSTRUCTURES AND METHODS FOR FORMING SAME

(71) Applicant: Global Wafers Co., Ltd., Hsinchu (TW)

(72) Inventors: Jia-Zhe Liu, Hsinchu (TW); Yen Lun Huang, Hsinchu (TW); Manhsuan Lin, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 16 days.

(21) Appl. No.: 15/586,075

(22) Filed: May 3, 2017

(65) Prior Publication Data

US 2018/0323265 A1    Nov. 8, 2018

(51) Int. Cl.
  *H01L 21/00*    (2006.01)
  *H01L 29/36*    (2006.01)
  *H01L 21/02*    (2006.01)
  *H01L 29/20*    (2006.01)
  *H01L 29/205*   (2006.01)
  *H01L 29/207*   (2006.01)

(52) U.S. Cl.
  CPC ........ *H01L 29/365* (2013.01); *H01L 21/0242* (2013.01); *H01L 21/0251* (2013.01); *H01L 21/0254* (2013.01); *H01L 21/0257* (2013.01); *H01L 21/02378* (2013.01); *H01L 21/02381* (2013.01); *H01L 21/02389* (2013.01); *H01L 21/02458* (2013.01); *H01L 21/02507* (2013.01); *H01L 29/2003* (2013.01); *H01L 29/205* (2013.01); *H01L 29/207* (2013.01)

(58) Field of Classification Search
  None
  See application file for complete search history.

(56) References Cited

U.S. PATENT DOCUMENTS

2013/0069208 A1*   3/2013   Briere ............... H01L 21/0237
                                                    257/655

* cited by examiner

*Primary Examiner* — Reema Patel
(74) *Attorney, Agent, or Firm* — Osha Liang LLP

(57) ABSTRACT

A heterostructure includes a substrate; an intermediate layer disposed on the substrate; and a group III-V layer having a first primary surface disposed on the intermediate layer and a dopant concentration that varies in a manner including a plurality of ramps with at least one of increasing dopant concentration and decreasing dopant concentration, along the growth direction from the first primary surface throughout the layer's thickness before terminating in a second primary surface.

21 Claims, 6 Drawing Sheets

SEMICONDUCTOR HETEROSTRUCTURES AND METHODS FOR FORMING SAME

BACKGROUND

Nitride semiconductors are used in the creation of new solid-state lighting, highly efficient amplifiers for wireless communications, advanced power electronics with unprecedentedly low losses, and a large array of new high performance devices, for example.

Group III-V semiconductors, such as gallium nitride (GaN) or other III-Nitride materials (e.g., semiconductor compounds that include nitrogen and at least one element from group III of the Periodic Table of the Elements), are used in many microelectronic implementations in which high power density and high efficiency switching are required. Examples of such implementations include field-effect transistors (FETs) and high electron mobility transistors (HEMTs).

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In one aspect, embodiments disclosed herein relate to a heterostructure, that includes a substrate; an intermediate layer disposed on the substrate; and a group III-V layer having a first primary surface disposed on the intermediate layer and a dopant concentration that varies in a manner including a plurality of ramps with at least one of increasing dopant concentration and decreasing dopant concentration, along the growth direction from the first primary surface throughout the layer's thickness before terminating in a second primary surface.

In another aspect, embodiments disclosed herein relate to a heterostructure, that includes a substrate; an intermediate layer disposed on the substrate; and a group III-V layer having a first primary surface disposed on the intermediate layer and a dopant concentration that varies in a periodic manner, the periodic manner including a plurality of ramps along the growth direction from the first primary surface throughout the layer's thickness before terminating in a second primary surface.

In yet another aspect, embodiments disclosed herein relate to a method for fabricating a heterostructure, that includes depositing an intermediate layer on the substrate; and depositing a group III-V layer on the intermediate layer, the group III-V layer having a dopant concentration that varies in a manner including a plurality of ramps with at least one of increasing dopant concentration and decreasing dopant concentration, along the growth direction from the first primary surface throughout the layer's thickness before terminating in a second primary surface.

Other aspects and advantages of the claimed subject matter will be apparent from the following description and the appended claims.

DETAILED DESCRIPTION

Figure 1:
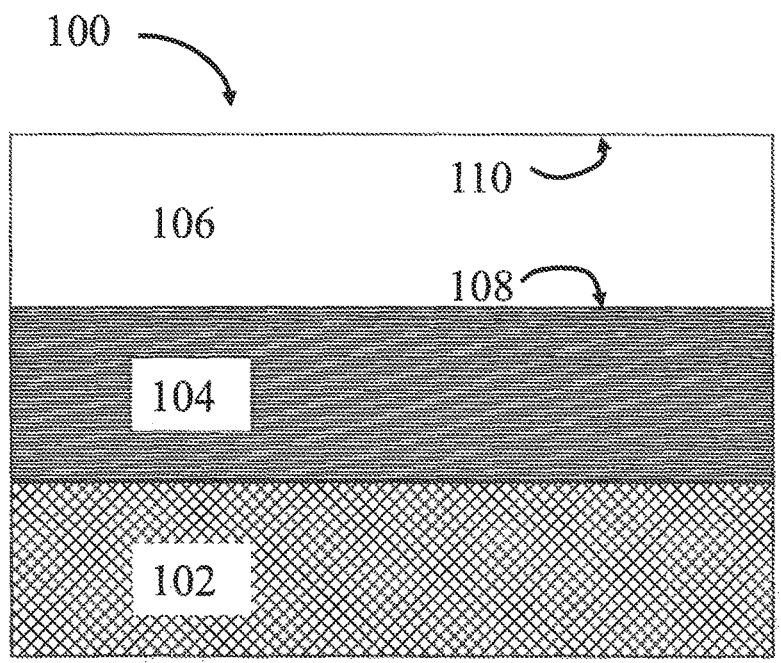
FIG. 1 depicts an embodiment of a semiconductor heterostructure according to the present disclosure.

Embodiments disclosed herein relate generally to semiconductor heterostructure compositions and methods of making said heterostructure compositions. More specifically, embodiments disclosed herein relate generally to semiconductor heterostructures that include a substrate, an intermediate layer, and a group III-V layer that has a dopant concentration that varies throughout the layer.

Group III-V semiconductors include III-Nitride materials formed of gallium nitride (GaN) and/or its alloys, such as aluminum gallium nitride (AlGaN), indium gallium nitride (InGaN) and aluminum indium gallium nitride (AlInGaN). These materials are semiconductor compounds that have a relatively wide, direct bandgap and strong piezoelectric polarizations, and can enable high breakdown fields and the creation of two-dimensional electron gases (2DEGs). As a result, III-Nitride materials such as GaN are used in many microelectronic implementations in which high power density and high efficiency switching are required. Examples of such implementations include field-effect transistors (FETs), high electron mobility transistors (HEMTs), and diodes.

Although the intrinsic material properties of III-Nitride semiconductors enable fabrication of high performance devices in theory, as a practical matter, conventional growth environments for III-Nitride materials typically include impurity sources that can impair their performance. For example, the presence of impurity sources in the Nitride growth environment can cause unintentional doping of critical device layers. In HEMTs, for example, as well as in other high speed switching devices, such unintentional impurity doping may adversely compromise device performance. However, in the present application, the careful manipulation of the growth conditions/environment used to produce III-Nitride or other group III-V semiconductor materials is used to selectively and controllably modulate the impurity/dopant profiles within certain key device regions to enhance or optimize performance. For example, the selective modulation of the dopant concentration within a III-V layer may improve the structural integrity and quality of the epitaxially deposited layer and may also reduce current collapse which adversely affect the dynamic electrical characteristics of the III-V layer.

In general, when growing a gallium nitride layer epitaxially the reactants are ammonia ($NH_3$) and trimethylgallium (TMGa) or triethylgallium (TEGa), which are reacted in the gas phase. In one or more embodiments, the ratio of ammonia and gallium compound used in the reactant mixture may be adjusted during the growth of the gallium nitride III-V layer to include a higher amount of ammonia or a higher amount of gallium compound. As will be discussed further below, the ratio of ammonia and gallium compound in the reactant mixture may be adjusted during the growth of the gallium nitride layer in order to modulate the dopant concentration in the grown layer. In this way, a gallium nitride layer that has a controlled dopant concentration profile (i.e., the relative change in dopant concentration as the layer is grown), may be created.

In one or more embodiments, the dopant concentration may be selectively modulated during the growth of the MN layer by adjusting not only the ratio of ammonia and gallium compound used, but also the growth rate, pressure, and/or the growth temperature during the gallium nitride III-V layer's fabrication. In one or more embodiments, only one of these factors may be manipulated to modulate/adjust the dopant concentration during the growth of the III-V layer or, in other embodiments, two or more of these factors may be manipulated to modulate/adjust the dopant concentration. For example, an increase in the ammonia concentration used in the reactant mixture, a decrease in the growth rate, an increase in the pressure within the growth system, and/or an increase in the growth temperature may result in a decrease in the dopant concentration in the III-V layer of the present disclosure. The opposite of the manipulations described above may be used to increase the dopant concentration in the III-V layer of the present disclosure. Thus, the ammonia and gallium compound ratio, the growth rate, pressure, and/or the growth temperature may be carefully and selectively modulated during fabrication of the III-V layer in order to increase or decrease the dopant concentration. In one or more embodiments, the dopant concentration in the III-V layer may vary throughout the layer's thickness, with some regions having a dopant concentration less than about $1\times10^{18}/cm^3$ and other regions having a dopant concentration greater than about $2\times10^{19}/cm^3$ with the dopant concentration dependent on the conditions used to grow the III-V layer, as discussed above. In other embodiments, the dopant concentration in the III-V layer varies throughout the layer's thickness with some regions having a dopant concentration less than about $5\times10^{18}/cm^3$ and other regions having a dopant concentration greater than $5\times10^{18}/cm^3$.

As an example of a group III-V layer epitaxial growth strategy, according to one or more embodiments of the present disclosure the group III-V layer may be grown for particular thickness at a stable temperature less than about 1000° C., a stable growth rate of greater than about 3 μm/hr, and a stable pressure of less than about 200 Torr. These conditions may lead to a group III-V layer with a stable dopant concentration greater than about $5\times10^{18}/cm^3$. After growth at these conditions for a particular thickness, the temperature may be continuously ramped up to a temperature greater than about 1000° C. the growth rate may be continuously ramped down to less than 3 μm/hr, and the pressure may be continuously ramped up to a pressure greater than about 200 Torr. These ramping conditions may lead to a group III-V layer with a dopant concentration that starts at greater than about $5\times10^{18}/cm^3$, or greater than about $2\times10^{19}/cm^3$ as indicated above, and continuously ramps down to a dopant concentration less than about $5\times10^{18}/cm^3$, or less than about $1\times10^{18}/cm^3$ as indicated above. The growth conditions may once again be stabilized so that a group III-V layer having a stable dopant concentration of less than about $5\times10^{18}/cm^3$, or less than about $1\times10^{18}/cm^3$ as indicated above, may be fabricated over a particular thickness. After growth at these conditions for a particular thickness, the temperature may be continuously ramped down to a temperature less than about 1000° C., the growth rate may be continuously ramped up to greater than 3 μm/hr, and the pressure may be continuously ramped down to a pressure less than about 200 Torr. These ramping conditions may lead to a group layer with a dopant concentration that starts at less than about $5\times10^{18}/cm^3$, or less than about $1\times10^{18}/cm^3$ as indicated above, and continuously ramps up to a dopant concentration greater than about $5\times10^{18}/cm^3$, or greater than about $2\times10^{19}/cm^3$ as indicated above. The growth conditions may once again be stabilized so that a group III-V layer having a stable dopant concentration of greater than about $5\times10^{18}/cm^3$, or greater than about $2\times10^{19}/cm^3$ as indicated above, may be fabricated over a particular thickness. This particular sequence of growth condition modifications may be repeated as desired in order to modulate the dopant concentration throughout the thickness of a group III-V layer.

In one or more embodiments, the dopants that may be selectively modulated may include at least one of carbon (C), oxygen (O), hydrogen (H), silicon (Si), germanium (Ge), magnesium (Mg), beryllium (Be), zinc (Zn), iron (Fe), chromium (Cr), and cadmium (Cd). These dopants may be unintentionally present or selectively introduced to specific layers or structures in a III-Nitride or other group III-V semiconductor structure according to the present disclosure. Furthermore, while these specific dopants are described, it will be appreciated that additional dopants can be included in a semiconductor structure without departing from the scope of the present concepts.

In one or more embodiments, the dopant concentration may vary in a periodic or a non-periodic manner throughout a doped layer's thickness. Specifically, in this disclose a dopant concentration that is said to vary in a periodic manner is a concentration that changes in a repetitive manner throughout the layer's thickness, while a dopant concentration that is non-periodic does not repeat. For example, in a periodic change in dopant concentration, if the dopant concentration starts at a concentration A and changes to a concentration B before changing back to a concentration A, then this general pattern would repeat. Further, in order to be considered periodic the thickness of each particular concentration level (e.g., A and B) is also repeated along with any transition thickness (e.g., the thickness as the dopant concentration is changed from concentration A to concentration B). FIGS. 2-12 presented in this application, and discussed below, will help to further explain what is meant by a periodic and non-periodic change in dopant concentration.

FIG. 1 presents a cross-sectional view of an embodiment of a semiconductor heterostructure according to the present disclosure. The semiconductor heterostructure 100 includes a substrate 102, an intermediate layer 104 disposed on the upper surface of the substrate 102, and a group III-V layer 106 disposed on an upper surface of the intermediate layer 104. As shown in FIG. 1, the group III-V layer 106 has a lower surface 108 and an upper surface 110, which may also be referred to as primary surfaces, and the distance between these surfaces is considered the thickness of the group III-V layer. It is to be understood that the phrase "disposed on" in the present application may mean disposed directly on a surface or disposed indirectly on a surface. For example, a layer disposed directly on a surface means that there is physical contact between the layer and the surface, whereas a layer disposed indirectly on a surface means that there may be a separate layer disposed between the subject layer and the surface mentioned.

In one or more embodiments, the substrate of the heterostructure may be formed from one of silicon (Si), silicon carbide (SiC), gallium nitride (GaN), or sapphire ($Al_2O_3$). In one or more embodiments, a semiconductor heterostructure of the present disclosure, and as depicted in FIG. 1, may also include a nucleation layer disposed in between the substrate and the intermediate layer. In these embodiments, the nucleation layer may be disposed on the entirety of the upper surface of the substrate and the intermediate layer may be disposed on the entirety of the upper surface of the nucleation layer. The nucleation layer may comprise aluminum nitride.

In one or more embodiments, the intermediate layer may be formed from aluminum nitride, an alloy of gallium nitride, such as those indicated above, or an alloy of aluminum and gallium, such as $Al_xGa_{1-x}N$, where $0 \leq X \leq 1$. In one or more embodiments, the intermediate layer may have a graded structure and/or a superlattice structure. More specifically, a graded structure refers to a layer that has a concentration variation throughout the structure (e.g., the value of X in $Al_xGa_{1-x}N$ varies throughout the layer), while a superlattice structure is a laminated structure that comprises at least two different layers repeated many times. In one or more embodiments, the laminated structure may be repeated layers of AlN and AlGaN layers.

In one or more embodiments, the group III-V layer has a dopant concentration that varies in either a periodic or a non-periodic manner throughout its thickness or through at least a portion of its thickness. As is described in greater detail below, the dopant concentrations or dopant concentration profile (i.e., the relative change in dopant concentration as the layer increases in thickness) of the group III-V layer can be varied in a number of ways.

In one or more embodiments, a group layer may have a varying dopant concentration that includes at least one continuous ramp along the growth direction, a continuous ramp meaning a thickness region where the dopant concentration is either increasing or decreasing continuously at a consistent rate. The thickness of the region of the continuous ramp may be from about 0.001 μm to 20 μm or from about 0.01 μm to 0.5 μm. In one or more embodiments, there may be multiple continuous ramp regions in the group III-V layer and the multiple regions of thickness where the dopant concentration is continuously ramped to a higher or lower dopant concentration may all be substantially the same thickness, may become thinner when proceeding in the growth direction of the III-V layer, may become thicker when proceeding in the growth direction, or any combination of the above when considering the case of embodiments including both continuous ramps from high to low dopant concentration regions and continuous ramps from low to high dopant concentration regions.

The use of a continuous ramp may increase the epitaxial quality of a group III-V layer that has variations in the carbon concentration throughout its thickness as there is no abrupt change in dopant concentration which can complicate the growth of the layer. Further, the use of continuous ramps to connect regions of high and low dopant concentrations may take less time than abrupt changes in dopant concentration as abrupt changes may require interruptions in layer growth in order to change the temperature, pressure, or other environmental conditions of the growth to modulate the dopant concentration so that an abrupt change in dopant concentration occurs.

In one or more embodiments, the varying dopant concentration may include at least one abrupt concentration change, an abrupt concentration change meaning a rapid increase or decrease in dopant concentration.

In one or more embodiments, the group III-V layer may have at least one thickness region where the dopant concentration remains substantially constant, whether a relatively high concentration or a relatively low concentration. The thickness of the region of the region where the dopant concentration remains substantially constant may be from about 0.001 μm to 20 μm. In one or more embodiments, there may be multiple regions of thickness where the dopant concentration remains substantially the same, whether relatively high concentrations and/or a relatively low concentrations, the regions separated by either an abrupt concentration change (e.g. low to high or high to low) or a continuous ramp. In one or more embodiments, the multiple regions of thickness where the dopant concentration remains substantially the same may all be substantially the same thickness, may become thinner when proceeding in the growth direction of the III-V layer, may become thicker when proceeding in the growth direction, or any combination of the above when considering the case of embodiments including both multiple high and low dopant concentration regions that remains substantially the same. As an example of the latter condition, the high dopant concentration regions that remain substantially the same concentration may decrease in thickness in the III-V layer growth direction, while the low dopant concentration regions that remain substantially the same concentration may increase in thickness in the III-V layer growth direction.

FIGS. 2-12 show some particular embodiments of dopant concentration variation throughout the thickness of a group III-V layer. In each embodiment shown, the leftmost portion of the X-axis corresponds to the lower surface (or first primary surface) 108 of the group III-V layer shown in FIG. 1, while the rightmost portion of the X-axis corresponds to the upper surface (or second primary surface) 110 of the group III-V body. The Y-axis reflects the relative dopant concentration and therefore the variation in the dopant concentration throughout the thickness of the group III-V layer may be depicted from left to right.

Figure 2:
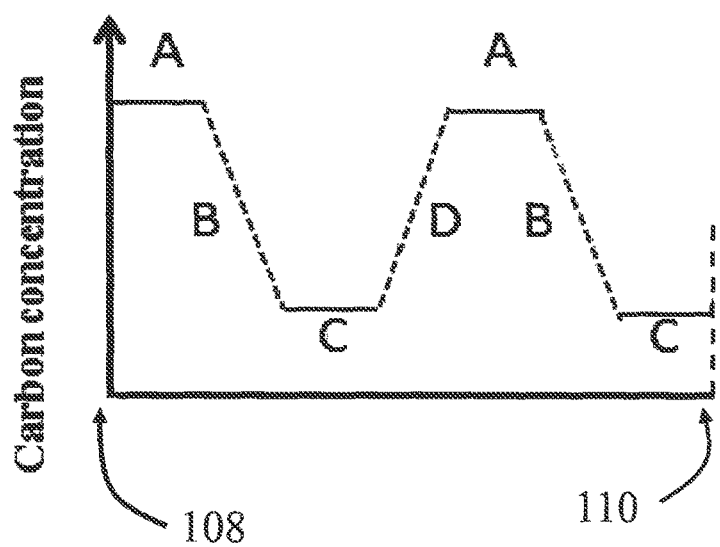
FIG. 2 depicts an embodiment of a dopant concentration variation within a group III-V layer of the present disclosure.

FIG. 2 depicts an embodiment of a dopant concentration variation within a group III-V layer of the present disclosure. As can be seen, the dopant concentration begins at a high concentration level, decreases at continuous rate to a lower concentration level, and increases at a continuous rate to the same high concentration level before repeating the sequence. FIG. 2 shows a periodic variation in the dopant concentration as it shows a repetitive sequence.

Figure 3:
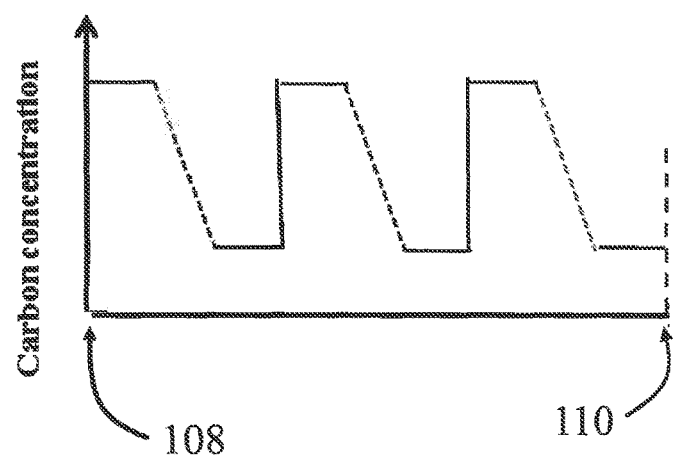
FIG. 3 depicts an embodiment of a dopant concentration variation within a group III-V layer of the present disclosure.

FIG. 3 depicts an embodiment of a dopant concentration variation within a group III-V layer of the present disclosure. As can be seen, the dopant concentration begins at a high concentration level, decreases at continuous rate to a lower concentration level, and increases rapidly to the same high concentration level before repeating the sequence. FIG. 3 shows a periodic variation in the dopant concentration as it shows a repetitive sequence.

Figure 4:
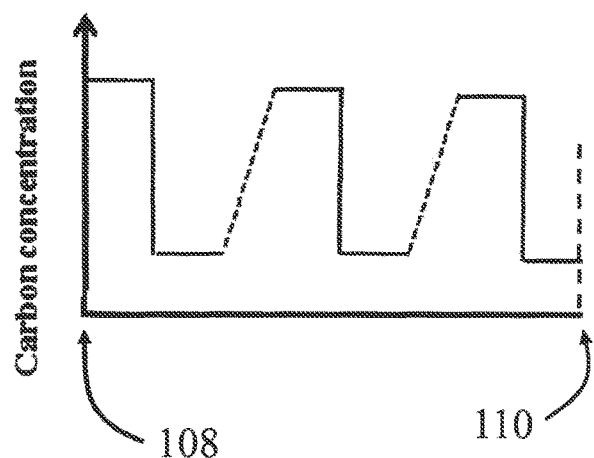
FIG. 4 depicts an embodiment of a dopant concentration variation within a group III-V layer of the present disclosure.

FIG. 4 depicts an embodiment of a dopant concentration variation within a group III-V layer of the present disclosure.

As can be seen, the dopant concentration begins at a high concentration level, decreases rapidly to a lower concentration level, and increases at a continuous rate to the same high concentration level before repeating the sequence. FIG. 4 shows a periodic variation in the dopant concentration as it shows a repetitive sequence.

Figure 5:
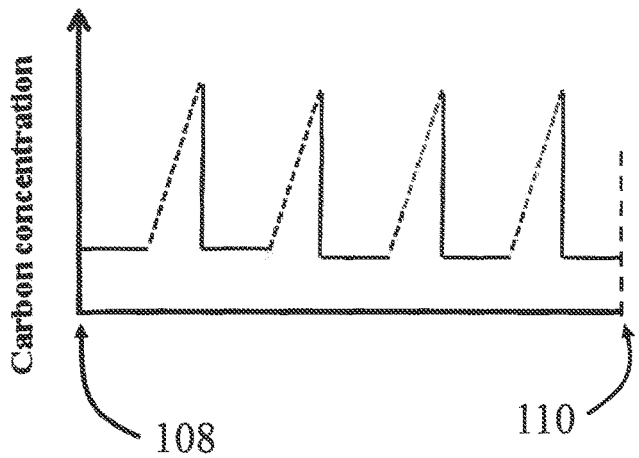
FIG. 5 depicts an embodiment of a dopant concentration variation within a group III-V layer of the present disclosure.

FIG. 5 depicts an embodiment of a dopant concentration variation within a group III-V layer of the present disclosure. As can be seen, the dopant concentration begins at a low concentration level, increases at continuous rate to a higher concentration level, and decreases rapidly to the same low concentration level before repeating the sequence. FIG. 5 shows a periodic variation in the dopant concentration as it shows a repetitive sequence.

Figure 6:
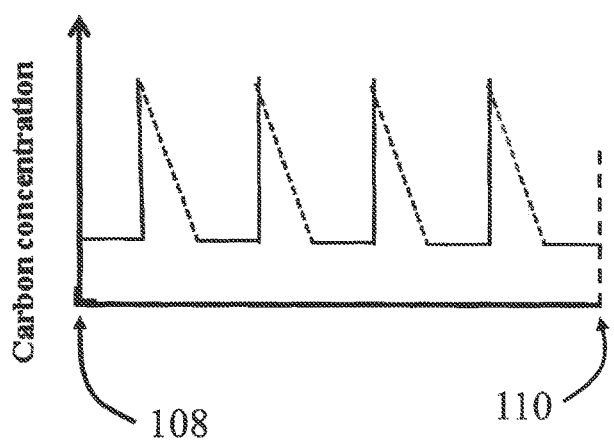
FIG. 6 depicts an embodiment of a dopant concentration variation within a group III-V layer of the present disclosure.

FIG. 6 depicts an embodiment of a dopant concentration variation within a group III-V layer of the present disclosure. As can be seen, the dopant concentration begins at a low concentration level, increases rapidly to a higher concentration level, and decreases at continuous rate to the same low concentration level before repeating the sequence. FIG. 6 shows a periodic variation in the dopant concentration as it shows a repetitive sequence.

Figure 7:
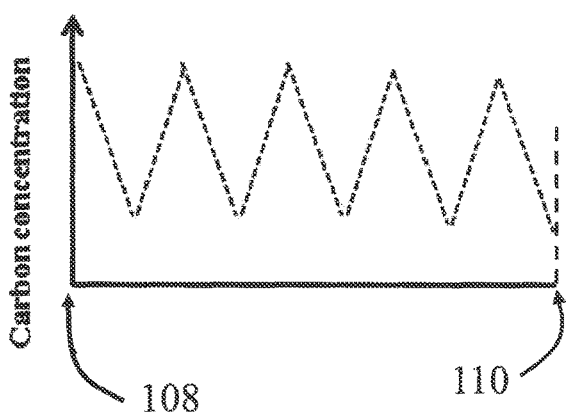
FIG. 7 depicts an embodiment of a dopant concentration variation within a group III-V layer of the present disclosure.

FIG. 7 depicts an embodiment of a dopant concentration variation within a group III-V layer of the present disclosure. As can be seen, the dopant concentration begins at a high concentration level, decreases at continuous rate to a lower concentration level, and immediately increases at a continuous rate to the same high concentration level before repeating the sequence by immediately decreasing to the same lower concentration level. FIG. 7 shows a periodic variation in the dopant concentration as it shows a repetitive sequence.

Figure 8:
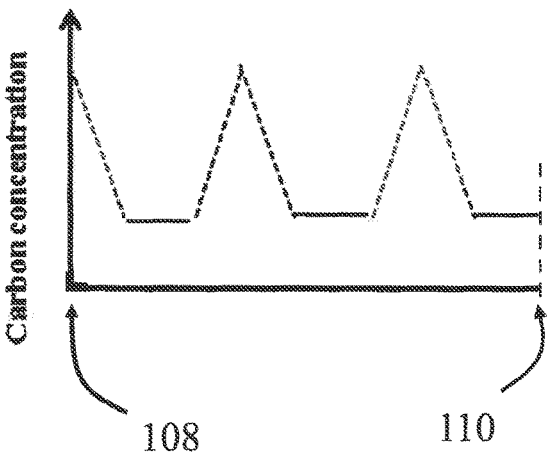
FIG. 8 depicts an embodiment of a dopant concentration variation within a group III-V layer of the present disclosure.

FIG. 8 depicts an embodiment of a dopant concentration variation within a group III-V layer of the present disclosure. As can be seen, the dopant concentration begins at a high concentration level, decreases at continuous rate to a lower concentration level, and increases at a continuous rate to the same high concentration level before repeating the sequence. FIG. 8 shows a periodic variation in the dopant concentration as it shows a repetitive sequence.

Figure 9:
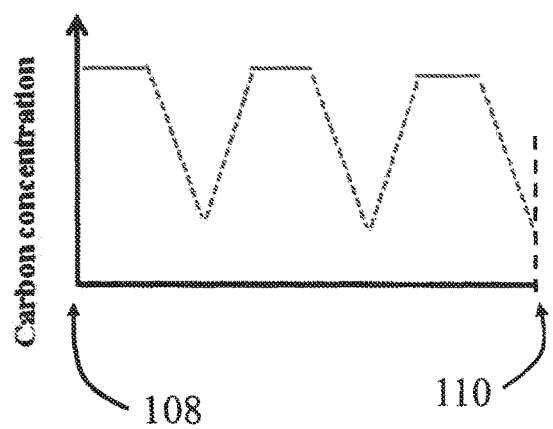
FIG. 9 depicts an embodiment of a dopant concentration variation within a group III-V layer of the present disclosure.

FIG. 9 depicts an embodiment of a dopant concentration variation within a group III-V layer of the present disclosure. As can be seen, the dopant concentration begins at a high concentration level, decreases at continuous rate to a lower concentration level, and immediately increases at a continuous rate to the same high concentration level before repeating the sequence. FIG. 9 shows a periodic variation in the dopant concentration as it shows a repetitive sequence.

Figure 10:
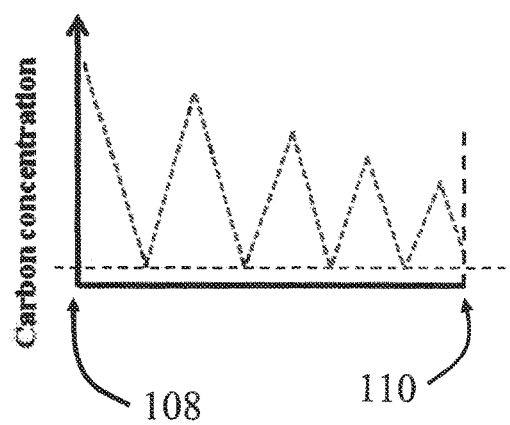
FIG. 10 depicts an embodiment of a dopant concentration variation within a group III-V layer of the present disclosure.

FIG. 10 depicts an embodiment of a dopant concentration variation within a group III-V layer of the present disclosure. As can be seen, the dopant concentration begins at a high concentration level, decreases at continuous rate to a lower concentration level, and immediately increases at a continuous rate to a higher concentration level, although not as high as the previous high concentration level, before immediately decreasing to the same lower concentration level. FIG. 10 shows a non-periodic variation in the dopant concentration as it shows a nonrepetitive sequence (i.e., each successive "high" concentration level is lower than the previous "high" concentration level).

Figure 11:
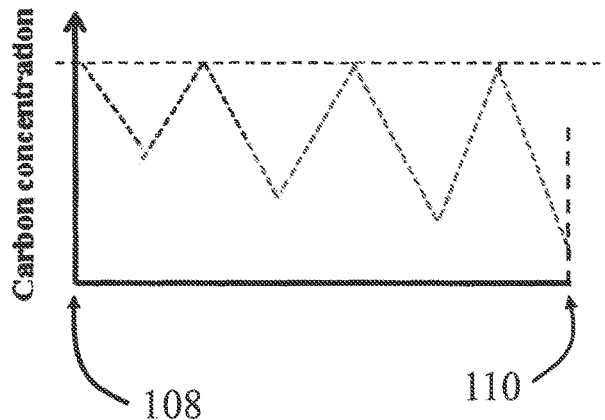
FIG. 11 depicts an embodiment of a dopant concentration variation within a group III-V layer of the present disclosure.

FIG. 11 depicts an embodiment of a dopant concentration variation within a group III-V layer of the present disclosure. As can be seen, the dopant concentration begins at a high concentration level, decreases at continuous rate to a low concentration level, and immediately increases at a continuous rate to the same high concentration level before immediately decreasing to a lower concentration level, wherein the lower concentration level is lower than the previous low concentration level. FIG. 11 shows a non-periodic variation in the dopant concentration as it shows a nonrepetitive sequence (i.e., each successive "low" concentration level is lower than the previous "low" concentration level).

Figure 12:
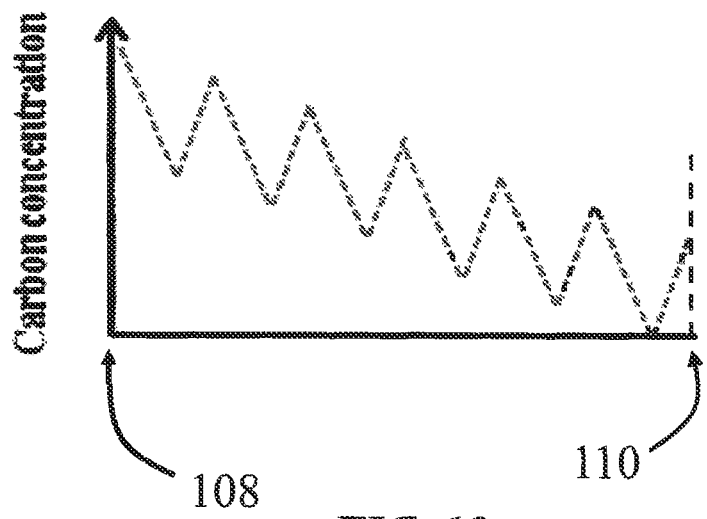
FIG. 12 depicts an embodiment of a dopant concentration variation within a group III-V layer of the present disclosure.

FIG. 12 depicts an embodiment of a dopant concentration variation within a group III-V layer of the present disclosure. As can be seen, the dopant concentration begins at a high concentration level, decreases at continuous rate to a low concentration level, and immediately increases at a continuous rate to a high concentration level, although not as high as the previous high concentration level, before immediately decreasing to a lower concentration level, wherein the lower concentration level is lower than the previous low concentration level. FIG. 12 shows a non-periodic variation in the dopant concentration as it shows a non-repetitive sequence (i.e., each successive "high" concentration level is lower than the previous "high" concentration level and each successive "low" concentration level is lower than the previous "low" concentration level).

EXAMPLES

Two heterostructures were prepared with one (Ex. 1) having a layer that includes continuous ramp layers that connect the multiple dopant concentration regions that have substantially the same dopant concentration (high and low dopant concentration regions). Thus, Example 1 has a dopant concentration profile in the III-V layer that is similar to that which is shown in FIG. 2.

Figure 13:
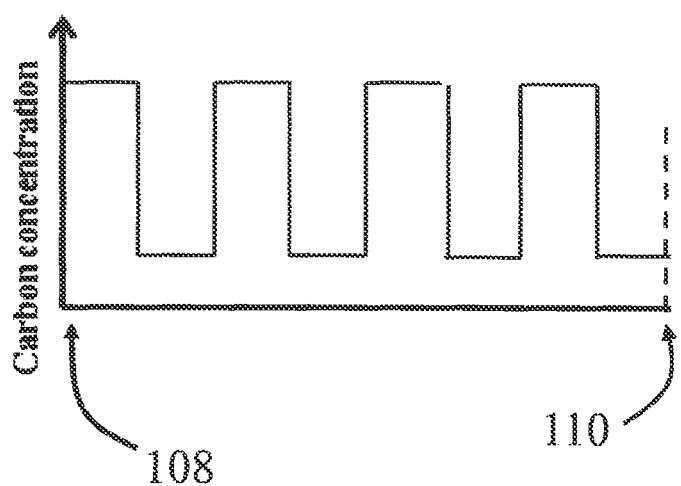
FIG. 13 depicts an embodiment of a dopant concentration variation within a group III-V layer that is not according to the present disclosure.

The other heterostructure (Comp. Ex. 1) has a III-V layer that includes no continuous ramp layer connecting the multiple dopant concentration regions that have substantially the same dopant concentration (high and low dopant concentration regions) and instead connects them via abrupt changes in dopant concentration. Thus, Comparative Example 1 has a dopant concentration profile in the III-V layer that is similar to that which is shown in FIG. 13. The heterostructures in Ex. 1 and Comp. Ex. 1 both had identical basic structures including a silicon substrate, an AlN layer disposed on the silicon substrate, an AlGaN layer disposed on the AlN layer, wherein the Al concentration decreases from the contact point with the AlN layer to an upper surface, and a carbon doped GaN layer (c-GaN) disposed on the upper surface of the AlGaN layer. The dopant concentration profile of the c-GaN layers was the only difference between Ex. 1 and Comp. Ex. 1 and are as described above.

After cooling the heterostructures down to room temperature after their synthesis, it was observed that the crack length in the heterostructure of Example 1 was about 1.1 mm, which was less than the crack length of about 1.9 mm observed for the heterostructure of Comparative Example 1.

Figure 14:
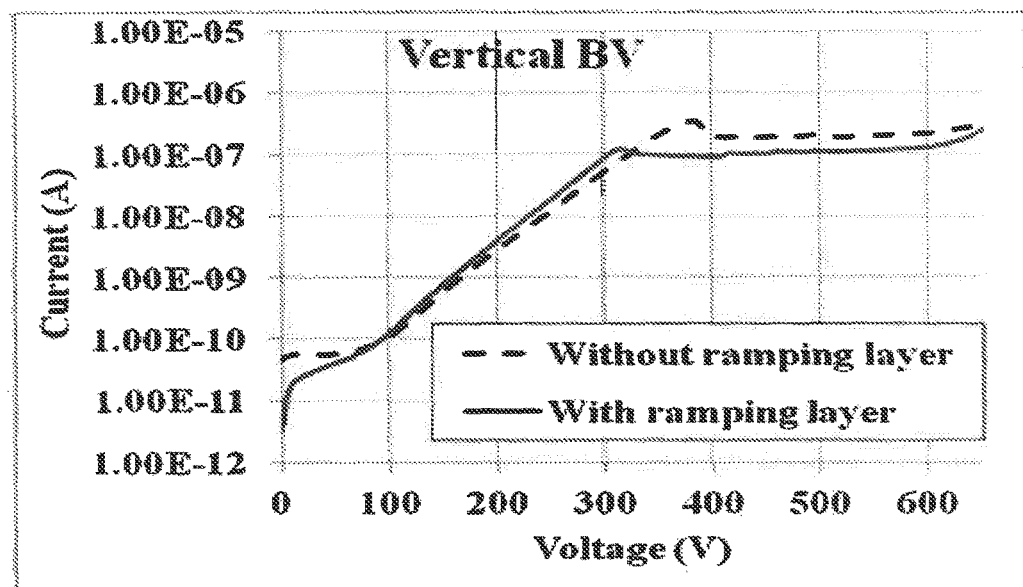
FIG. 14 shows a plot of the vertical breakdown voltage of the heterostructure of Example 1 and the heterostructure of Comparative Example 1.

FIG. 14 shows a plot of the vertical breakdown voltage of the heterostructure of Example 1 and the heterostructure of Comparative Example 1. The current at 600 V for Example 1 was $1.3 \times 10^{-7}$ amps, while the current at 600 V for Comparative Example 1 was $2.3 \times 10^{-7}$ amps, indicating a lower leakage current in Example 1.

Figure 15:
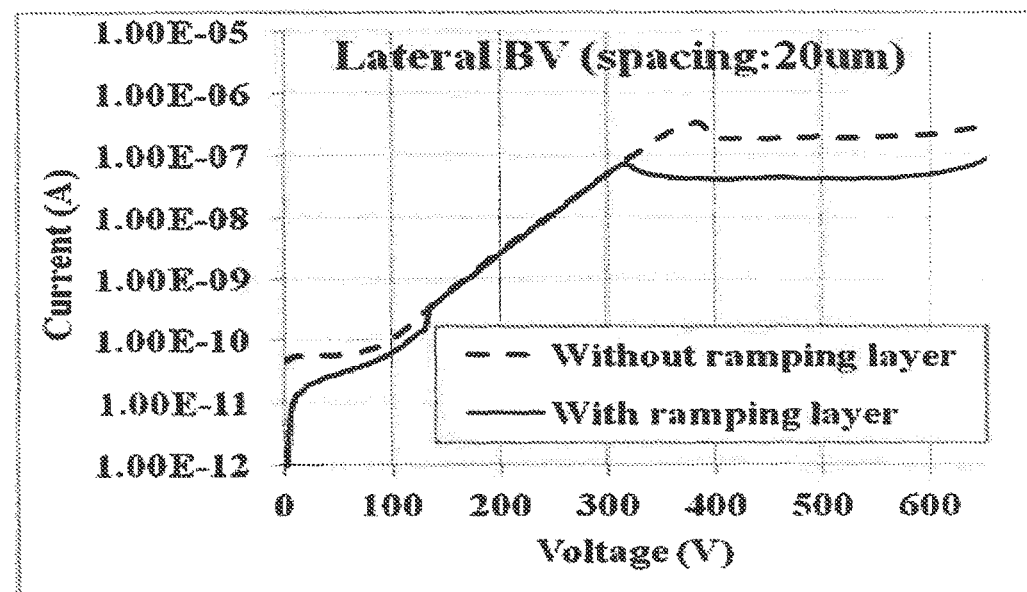
FIG. 15 shows a plot of the lateral breakdown voltage of the heterostructure of Example 1 and the heterostructure of Comparative Example 1.

FIG. 15 shows a plot of the lateral breakdown voltage of the heterostructure of Example 1 and the heterostructure of Comparative Example 1. The current at 600 V for Example 1 was $5 \times 10^{-8}$ amps, while the current at 600 V for Comparative Example 1 was $2 \times 10^{-7}$ amps, indicating a lower leakage current in Example 1.

In sum, the semiconductors described herein are better quality than semiconductors known to skilled artisans. Specifically, the dopant concentration profiles with one or more continuous ramps for the III-V layer of the semiconductors disclosed herein may make the III-V layers more crack resistant and exhibit reduced current collapse when compared to III-V layers that do not have such dopant concentration profiles as taught herein. Further, the method of forming the group III-V layer having the dopant concentration profiles with one or more continuous ramps as described herein may be more efficient than prior approaches at III-V layers with varying dopant concentrations because gradual changes in the dopant concentration are utilized, which would not without interrupt layer growth in order to modulate the dopant concentration and allows for quicker production and higher quality deposition of the III-V layer, particularly when compared to approaches that utilize abrupt increases/decreases in dopant concentrations.

While the disclosure sets forth various embodiments using specific block diagrams, flowcharts, and examples, each block diagram component, flowchart step, operation, and/or component described and/or illustrated herein may be implemented, individually and/or collectively, using a wide range of configurations. The process parameters and sequence of steps described and/or illustrated herein are given by way of example only. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

While the disclosure has been described with respect to a limited number of embodiments, those skilled in the art, having benefit of this disclosure, will appreciate that other embodiments can be devised which do not depart from the scope of the disclosure as disclosed herein. Furthermore, one of ordinary skill in the art would appreciate that certain "elements," "components," "parts." "units," or any nonce terms, if used to describe the present invention, may be implemented using any known methods. Accordingly, the scope of the disclosure should be limited only by the attached claims.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed:

1. A heterostructure, comprising:
   a substrate;
   an intermediate layer disposed on the substrate; and
   a group III-V layer having a first primary surface disposed on the intermediate layer and a dopant concentration that varies in a manner including a plurality of ramps with at least one of increasing dopant concentration and at least one of decreasing dopant concentration, along the growth direction from the first primary surface throughout the layer's thickness before terminating in a second primary surface.

2. The heterostructure of claim 1, wherein the dopant concentration varies in a manner including at least one ramp from a lower dopant concentration to a higher concentration, along the growth direction from the first primary surface throughout the layer's thickness before terminating in the second primary surface.

3. The heterostructure of claim 1, wherein dopant concentration varies along the growth direction of the group III-V layer by repeating a ramp from a region of higher dopant concentration to a region of lower dopant concentration and a ramp from a region of lower dopant concentration to a region of higher dopant concentration.

4. The heterostructure of claim 3, wherein each successive region of higher dopant concentration has a lower dopant concentration or a dopant concentration that is substantially the same with respect to a previous region of higher dopant concentration.

5. The heterostructure of claim 3, wherein each successive region of lower dopant concentration has a lower dopant concentration or a dopant concentration that is substantially the same with respect to a previous region of lower dopant concentration.

6. The heterostructure of claim 3, wherein each successive region of higher dopant concentration is thinner with respect to a previous region of higher dopant concentration.

7. The heterostructure of claim 3, wherein each successive region of lower dopant concentration is thicker with respect to a previous region of lower dopant concentration.

8. The heterostructure of claim 3, wherein each successive ramp from a region of higher dopant concentration to a region of lower dopant concentration is thinner with respect to a previous ramp from a region of higher dopant concentration to a region of lower dopant concentration.

9. The heterostructure of claim 3, wherein each successive ramp from a region of lower dopant concentration to a region of higher dopant concentration is thicker with respect to a previous ramp from a region of lower dopant concentration to a region of higher dopant concentration.

10. The heterostructure of claim 1, wherein the dopant is at least one of the group of carbon, oxygen, hydrogen, silicon, germanium, magnesium, beryllium, zinc, iron, chromium, and cadmium.

11. The heterostructure of claim 1, wherein the group III-V layer comprises at least one region not having a dopant.

12. A heterostructure, comprising:
    a substrate;
    an intermediate layer disposed on the substrate; and
    a group III-V layer having a first primary surface disposed on the intermediate layer and a dopant concentration that varies in a periodic manner, the periodic manner including a plurality of ramps along the growth direction from the first primary surface throughout the layer's thickness before terminating in a second primary surface;
    wherein the periodic manner includes at least one continuous ramp from a low dopant concentration to a high dopant concentration.

13. The heterostructure of claim 12, wherein the periodic manner includes at least one ramp from a high dopant concentration to a low dopant concentration.

14. The heterostructure of claim 12, wherein the highest dopant concentration of each successive ramp is substantially the same with respect to the highest dopant concentration of a previous ramp.

15. The heterostructure of claim 12, wherein the lowest dopant concentration of each successive ramp is substantially the same with respect to the lowest dopant concentration of a previous ramp.

16. The heterostructure of claim 12, wherein the dopant is at least one of the group of carbon, oxygen, hydrogen, silicon, germanium, magnesium, beryllium, zinc, iron, chromium, and cadmium.

17. A method for fabricating a heterostructure, comprising:

depositing an intermediate layer on the substrate; and depositing a group III-V layer on the intermediate layer, the group III-V layer having a dopant concentration profile that varies in a manner including a plurality of ramps with at least one of increasing dopant concentration and at least one of decreasing dopant concentration, along the growth direction from the first primary surface throughout the layer's thickness before terminating in a second primary surface.

18. The method of claim 17, wherein the group III-V body having a dopant concentration that varies in a periodic manner including at least one of a ramp from a high dopant concentration to a low dopant concentration and a ramp from a low dopant concentration to a high dopant concentration.

19. The method of claim 17, wherein one or more ramps of decreasing dopant concentration are made by controlling a temperature <1000° C. ramping up to a temperature >1000° C., by controlling a growth rate >3 um per hour ramping down to a growth rate <3 um per hour, or by controlling a pressure <200 Torr ramping up to a pressure >200 Torr.

20. The method of claim 17, wherein one or more ramps of increasing dopant concentration are made by controlling a temperature >1000° C. ramping down to a temperature <1000° C., by controlling a growth rate <3 um per hour ramping up to a growth rate >3 um per hour, or by controlling a pressure >200 Torr ramping down to a pressure <200 Torr.

21. The method according to claim 17, wherein one or more ramps have decreasing dopant concentration from >5E18/cm$^3$ ramping down to <5E18/cm$^3$ or have increasing dopant concentration from <5E18/cm$^3$ ramping up to >5E18/cm$^3$.

* * * * *